United States Patent
Guo et al.

(10) Patent No.: US 12,237,012 B2
(45) Date of Patent: Feb. 25, 2025

(54) METHOD FOR INFORMATION STORAGE BASED ON HYBRID MATERIAL

(71) Applicant: HPSTAR (Beijing), Beijing (CN)

(72) Inventors: Songhao Guo, Beijing (CN); Xujie Lv, Beijing (CN)

(73) Assignee: HPSTAR (Beijing), Beijing (CN)

( * ) Notice: Subject to any disclaimer, the term of this patent is extended or adjusted under 35 U.S.C. 154(b) by 35 days.

(21) Appl. No.: 18/477,013

(22) Filed: Sep. 28, 2023

(65) Prior Publication Data

US 2024/0112733 A1    Apr. 4, 2024

(30) Foreign Application Priority Data

Oct. 1, 2022   (CN) .......................... 202211217140.5

(51) Int. Cl.
*G11C 13/00* (2006.01)
*G11C 13/04* (2006.01)

(52) U.S. Cl.
CPC .......... *G11C 13/042* (2013.01); *G11C 13/048* (2013.01)

(58) Field of Classification Search
CPC .......................... G11C 11/5664; G11C 13/048
See application file for complete search history.

(56) References Cited

U.S. PATENT DOCUMENTS 6,280,904 B1 * 8/2001 Sokoluk ................... G03C 1/73
365/120

FOREIGN PATENT DOCUMENTS

CA            3230272 A1 *  3/2023  ........... C12Q 1/6806
WO   WO-2023038907 A1 *  3/2023  ........... C12Q 1/6806

* cited by examiner

*Primary Examiner* — Jay W. Radke
(74) *Attorney, Agent, or Firm* — GRUMBLES LAW PLLC; Brittany Haanan

(57) ABSTRACT

The present disclosure belongs to the technical field of information storage, and particularly relates to a method for information storage based on a hybrid material. The method for information storage based on a hybrid material provided by the present disclosure includes a step of applying an external force to a hybrid material for driving, such that the hybrid material shows a fluorescent state or a non-fluorescent state, thereby realizing two-state or three-state information storage. By only applying the external force to the selected hybrid material for driving, energy band alignment methods can be transformed under the driving of the external force with an energy level difference between different components in the hybrid material. Therefore, the hybrid material shows the component fluorescent state or the non-fluorescent state. One storage cell has two or three states, so the present disclosure can be used to store two-state or three-state data.

20 Claims, 5 Drawing Sheets

METHOD FOR INFORMATION STORAGE BASED ON HYBRID MATERIAL

CROSS REFERENCE TO RELATED APPLICATION

This patent application claims the benefit and priority of Chinese Patent Application No. 202211217140.5, filed with the China National Intellectual Property Administration on Oct. 1, 2022, the disclosure of which is incorporated by reference herein in its entirety as part of the present application.

TECHNICAL FIELD

The present disclosure belongs to the technical field of information storage, and particularly relates to a method for information storage based on a hybrid material.

BACKGROUND

With the development of such information technologies as artificial intelligence (AI), cloud computing and optical chips, increasingly requirements are imposed on storage and processing capacities of massive data. For the miniaturization of electronic devices and development of information technologies, looking for large-capacity information storage devices has become a problem to be solved urgently. For a large storage capacity, a fast read-write speed, a long service life and the like, a nonvolatile storage device hopefully breaks through the existing Von-Neumann computer architecture as a replacement of a dynamic random access memory (DRAM) and a flash memory, to realize a storage-computing integrated neural network architecture with low energy consumption and high speed.

However, existing information storage methods have some intractable problems. For example, the conventional optical storage depending on laser ablation causes a mechanical damage to the storage medium, the information erasable times is limited, and particularly pushes forward higher requirements on equipment precision during information reading. The conventional phase-transition memory devices rely on special phase transition storage materials such as GeSbTe and GeTe. These materials are prepared complexly by physical vapor deposition (PVD), chemical vapor deposition (CVD), atomic layer deposition (ALD), pulsed laser deposition (PLD), and the like to cause a high cost. In addition, existing common electronic memory chips require complex photoetching, and their information is lost easily that affecting the service life of the devices. Furthermore, concerning the conventional information storage methods, one storage cell can only store two states, causing a limited storage density.

In order to realize ultra-high-density data storage, there are usually two feasible strategies. Although the storage cells cannot be further downsized in a nanoscale due to limitations of the fabrication process, the fabricated three-dimensional (3D) stacked storage devices provide an effective way to realize the high-density data storage. Nevertheless, the 3D devices are fabricated with a complex process with high technical requirements, wasting time and labor. Another method for effectively improving the data storage density is to increase a number of storage states in each storage cell, namely from "0 and 1" to "0, 1, 2, . . . ". In 2008, ternary storage behaviors of a $Ge_2Sb_2Te_5$/GeTe nanowire based on a core-shell structure were first reported by an American scientist Agarwal. Specifically, when a pulsed electric field is applied to the nanowire, there are two phase transition processes from a crystalline state to an intermediate state and from the intermediate state to the amorphous state, thereby corresponding to three different conducting states "0", "1", and "2". This method successfully breaks through the conventional binary storage. However, only a very few cases on the ternary storage are reported in the prior art due to the lack of suitable functional material. This is also the reason why successful data storage cases in semiconductor materials, optical materials and magnetic materials are all mostly based on the binary system. Therefore, it is desired to provide a novel information storage method that capable of realizing ternary storage.

SUMMARY

A technical problem to be solved by the present disclosure is to provide a method for information storage based on a hybrid material. The storage method realizes information storage under the driving of an external force, and effectively solves problems of an information loss, a complex process, a low storage density and a complex material preparation method of a conventional storage method.

To solve the above-mentioned technical problem, a method for information storage based on a hybrid material provided by the present disclosure includes a step of applying an external force to a hybrid material for driving, such that the hybrid material shows a fluorescent state or a non-fluorescent state, thereby realizing information storage, where the hybrid material includes a component A and a component B; and an energy level difference is provided between the component A and the component B.

Specifically, in the hybrid material, at least one of an energy level difference (4E) between a conduction band of the component A and a conduction band of the component B, and an energy level difference (4E) between a valance band of the component A and a valance band of the component B is less than 200 meV, and more preferably less than 100 meV.

Specifically, a movement speed of each of the conduction band and the valance band of the component B is greater than a movement speed of each of the conduction band and the valance band of the component A.

Specifically, in the hybrid material, an energy of the conduction band of the component A is lower than an energy of the conduction band of the component B, and an energy of the valance band of the component A is higher than an energy of the valance band of the component B; and the energy level difference between the conduction band of the component A and the conduction band of the component B, and the energy level difference between the valance band of the component A and the valance band of the component B are less than 200 meV; or, in the hybrid material, an energy of the conduction band and an energy of the valance band of the component A are respectively lower than an energy of the conduction band and an energy of the valance band of the component B, and the energy level difference between the conduction band of the component A and the conduction band of the component B is less than 200 meV; or the energy of the conduction band and the energy of the valance band of the component A are respectively higher than the energy of the conduction band and the energy of the valance band of the component B, and the energy level difference between the valance band of the component A and the valance band of the component B is less than 200 meV.

Specifically, in the hybrid material, a lattice of the component B is more flexible than a lattice of the component A.

Specifically, the hybrid material includes an organic-inorganic hybrid material.

Preferably, the organic-inorganic hybrid material includes $(BTm)_2PbI_4$, $(4Tm)_2PbI_4$, $(2T)_2PbBr_4$, and $(4TCNm)_2PbI_4$.

Specifically, the external force includes a pressure and/or a tensile force.

Specifically, in the step of applying an external force for driving, an intensity of the external force is controlled at 0-6 GPa.

Specifically, if the energy of the conduction band of the component A is lower than the energy of the conduction band of the component B, and the energy of the valance band of the component A is higher than the energy of the valance band of the component B in the hybrid material, such as $(BTm)_2PbI_4$, when the external force is not applied or an external force with a first external force value is applied to the hybrid material, the hybrid material has type-I energy band alignment; and/or, when an external force with a second external force value is applied to the hybrid material, the hybrid material has type-II energy band alignment; and/or, when an external force with a third external force value is applied to the hybrid material, the hybrid material has the type-I energy band alignment.

Specifically, when the external force is not applied or the external force with the first external force value is applied to the hybrid material, the hybrid material shows a component A fluorescent state; and/or when the external force with the second external force value is applied to the hybrid material, the hybrid material shows the non-fluorescent state; and/or when the external force with the third external force value is applied to the hybrid material, the hybrid material shows a component B fluorescent state.

Specifically, if the energy of the conduction band and the energy of the valance band of the component A are respectively lower than the energy of the conduction band and the energy of the valance band of the component B, such as $(4TCNm)_2PbI_4$, or the energy of the conduction band and the energy of the valance band of the component A are respectively higher than the energy of the conduction band and the energy of the valance band of the component B, such as $(4Tm)_2PbI_4$ and $(2T)_2PbBr_4$, when the external force is not applied or an external force with a first external force value is applied to the hybrid material, the hybrid material has type-II energy band alignment; and/or, when an external force with a third external force value is applied to the hybrid material, the hybrid material has type-I energy band alignment.

Specifically, when the external force is not applied or the external force with the first external force value is applied to the hybrid material, the hybrid material shows the non-fluorescent state; and/or when the external force with the third external force value is applied to the hybrid material, the hybrid material shows a component B fluorescent state.

Specifically, the first external force value is less than the second external force value, and the second external force value is less than the third external force value; and preferably, the first external force value is not greater than 1 GPa, the second external force value is 2-3 GPa, and the third external force value is 4-5 GPa.

Specifically, the component A fluorescent state is defined as 0, the non-fluorescent state is defined as 1, and the component B fluorescent state is defined as 2, thereby realizing two or three storage states in one storage cell.

Specifically, the method further includes a step of synthesizing the hybrid material.

According to the method for information storage based on a hybrid material provided by the present disclosure, for a hybrid material capable of realizing three-state storage, an energy level difference is provided between a component A and a component B in the hybrid material. When no external force (a pressure or a tensile force) is applied to the hybrid material, the component A with a low energy of a conduction band and a high energy of a valance band shows fluorescence, and the material shows a component A fluorescent state. When the hybrid material is driven by the external force, the conduction band of the component A and the conduction band of the component B move downward, while the valance band of the component A and the valance band of the component B move upward. A movement speed of each of the conduction band and the valance band of the component B is greater than a movement speed of each of the conduction band and the valance band of the component A. Consequently, energy band alignment between the component A and the component B is changed. That is, when the pressure reaches a special value (depending on a specific material), the energy of the conduction band and the energy of the valance band of the component A are respectively lower than the energy of the conduction band and the energy of the valance band of the component B, or the energy of the conduction band and the energy of the valance band of the component A are respectively higher than the energy of the conduction band and the energy of the valance band of the component B, and the energy band alignment of the hybrid material is changed. Without the fluorescence, the hybrid material shows the non-fluorescent state. When the hybrid material is continuously driven by the external force, the conduction band of the component A and the conduction band of the component B continue to move downward, while the valance of the component A and the valance band of the component B continue to move upward. Consequently, the energy band alignment between the component A and the component B is changed continuously. That is, when the pressure reaches another special value (depending on a specific material), the energy of the conduction band of the component B is lower than the energy of the conduction band of the component A, and the energy of the valance band of the component B is higher than the energy of the valance band of the component A. Since the energy band alignment of the hybrid material is changed again, the component B shows fluorescence, and the hybrid material shows the component B fluorescent state. Therefore, under external forces with different intensities, the hybrid material shows the component A fluorescent state, the non-fluorescent state, and the component B fluorescent state. In information storage, the component A fluorescent state can be defined as 0, the non-fluorescent state can be defined as 1, and the component B fluorescent state can be defined as 2, thereby forming a storage method including 0, 1 and 2, and realizing three storage states in one storage cell.

Likewise, according to the method for information storage based on a hybrid material provided by the present disclosure, for a hybrid material capable of realizing two-state storage, the energy of the conduction band and the energy of the valance band of the component A are respectively lower than the energy of the conduction band and the energy of the valance band of the component B, or the energy of the conduction band and the energy of the valance band of the component A are respectively higher than the energy of the conduction band and the energy of the valance band of the component B. Without an external force, type-II energy band alignment is provided between the component A and the component B, and the material shows the non-fluorescent state. When an external force (a pressure or a tensile force) is applied, a movement speed of each of the conduction band and the valance band of the component B is greater than a movement speed of each of the conduction band and the valance band of the component A. Consequently, the energy band alignment between the component A and the component B is changed. That is, when the external force reaches a special value (depending on a specific material), the energy of the conduction band of the component B is lower than the energy of the conduction band of the component A, and the energy of the valance band of the component B is higher than the energy of the valance band of the component A. The hybrid material is transformed from the type-II energy band alignment to type-I energy band alignment, and shows the component B fluorescent state. In information storage, the non-fluorescent state can be defined as 0, and the component B fluorescent state can be defined as 1, thereby forming a storage method including 0 and 1, and realizing two storage states in one storage cell.

According to the method for information storage based on a hybrid material provided by the present disclosure, the fluorescent state of the hybrid material is changed by the external force, and the information storage is realized with the fluorescent state or the non-fluorescent state of the hybrid material. By only applying the external force to the selected hybrid material for driving, different energy band alignment methods can be transformed under the driving of the external force with an energy level difference between different components in the hybrid material. Therefore, the hybrid material shows two component fluorescent states and the non-fluorescent state, or the fluorescent state and the non-fluorescent state. One storage cell has two or three states, so the present disclosure can be used to store two-state or three-state data. By defining the three states as 0, 1 and 2 or the two states as 0 and 1, ternary or binary information storage is realized. Without increasing a complexity and a cost of the process, the present disclosure improves a storage density.

According to the method for information storage based on a hybrid material provided by the present disclosure, in the information storage, the intensity of the external force for state transformation depends on a category of the hybrid material, and can be adjusted by changing components in the hybrid material. The method for detecting storage information is simple, the fluorescence spectrum of the hybrid material is unnecessarily characterized, and there is not a precise component and a complex circuit.

The method for information storage based on a hybrid material provided by the present disclosure realizes information storage and erasure through the external force, with long storage time and nonvolatility. Particularly, the hybrid material is synthesized simply (such as a liquid phase method), without a complex process such as photoetching.

BRIEF DESCRIPTION OF THE DRAWINGS

To make the content of the present disclosure more comprehensible and clearer, the following describes the present disclosure in more detail with reference to the specific embodiments and accompanying drawings of the present disclosure.

DETAILED DESCRIPTION OF THE EMBODIMENTS

To make the objectives, technical solutions, and advantages of the embodiments of the present disclosure clearer, the technical solutions in the embodiments of the present disclosure are clearly and completely described below with reference to the embodiments of the present disclosure.

EMBODIMENT 1

In the embodiment, a hybrid material $(BTm)_2PbI_4$ is prepared with an anti-solvent diffusion method.

0.04 mmol of BTmI and 0.02 mmol of PbI2 are dissolved into 1 mL of gamma-butyrolactone. With chlorobenzene and chloroform as anti-solvents, bulk crystals can be obtained after 72 h.

EMBODIMENT 2

In the embodiment, a pressure is applied to the hybrid material $(BTm)_2PbI_4$ to obtain energy band alignment of the hybrid material. The energy band alignment of the hybrid material $(BTm)_2PbI_4$ is as shown in FIG. 1.

As can be seen, an energy of a conduction band of a component A is lower than an energy of a conduction band of a component B, and an energy of a valance band of the component A is higher than an energy of a valance band of the component B. Energy level differences ($\Delta E1$ and $\Delta E2$) between the component A and the component B are less than 200 meV. Through testing, energy level differences ($\Delta E1$ and $\Delta E2$) between the component [BTm] and the component $[PbI_4]$ in the hybrid material are about 80 meV.

Figure 1:
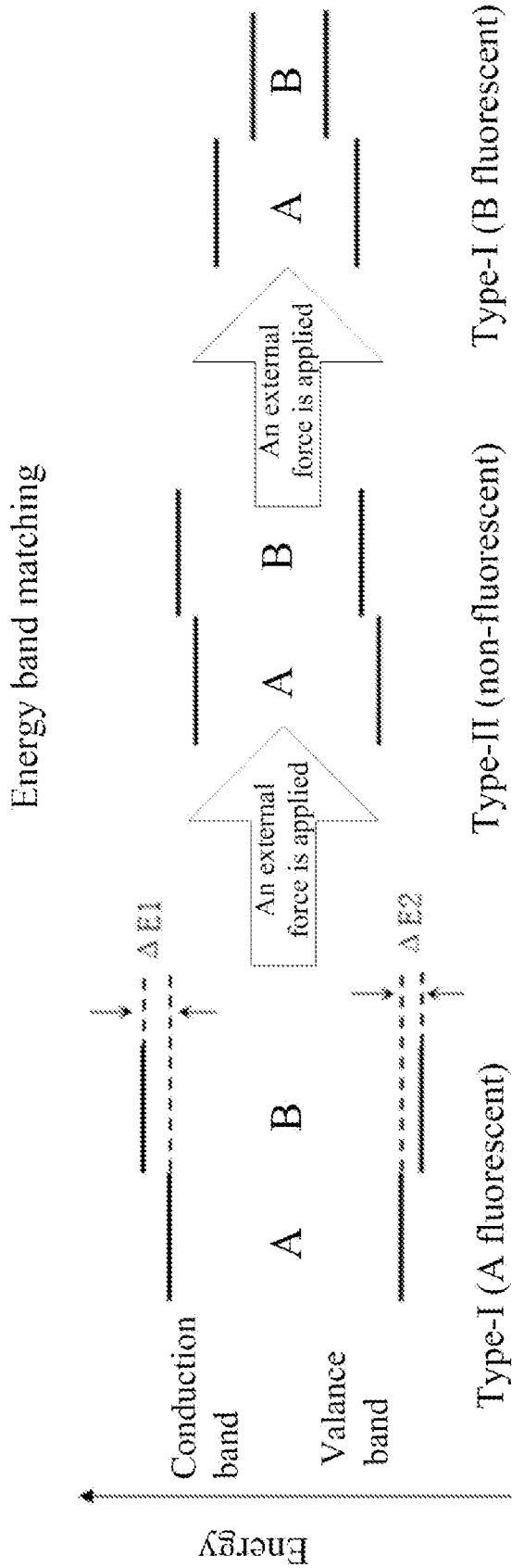
FIG. 1 illustrates transformation of type-I energy band alignment and type-II energy band alignment between a component A and a component B in a hybrid material according to Embodiment 1.

According to results shown in FIG. 1, without an external force, type-I energy band alignment is provided between the $[BTm^+]$ (component A) and the $[PbI_4]$ (component B), and the material shows a $[BTm^+]$ fluorescent state. When the external force (a pressure or a tensile force) is applied, the component $[BTm^+]$ and the component $[PbI_4]$ move downward in the conduction band, and move upward in the valance band. A movement speed of each of the conduction band and the valance band of the $[PbI_4]$ is greater than a movement speed of each of the conduction band and the valance band of the $[BTm^+]$. The energy band alignment between the $[BTm^+]$ and the $[PbI_4]$ is changed. As shown in FIG. 1, when the external force reaches a special value, the energy of the valance band of the $[PbI_4]$ is higher than the energy of the valance band of the $[BTm^+]$. The hybrid material is transformed from the type-I energy band alignment to type-II energy band alignment, and shows a non-fluorescent state. When the external force applied on the hybrid material reaches another special value, the energy of the condition band of the $[PbI_4]$ is lower than the energy of the conduction band of the $[BTm^+]$. The hybrid material is transformed from the type-II energy band alignment to the type-I energy band alignment, and shows a $[PbI_4]$ fluorescent state.

EMBODIMENT 3

In the embodiment, pressures with different intensities are applied to the hybrid material $(BTm)_2PbI_4$. A pressure environment is provided by a diamond anvil cell (DAC). Type II-a ultra-low fluorescent diamond with a size of 500 µm is used. A high-pressure sample chamber is composed of a stainless steel gasket with a thickness of about 50 µm and a hole with a diameter of about 300 µm. The hybrid material $(BTm)_2PbI_4$ and a pressure measuring ruby ball are placed into the chamber. A ruby fluorescence method is used for measuring the pressures, and a mineral oil is used as a pressure transmitting medium.

Figure 2A:
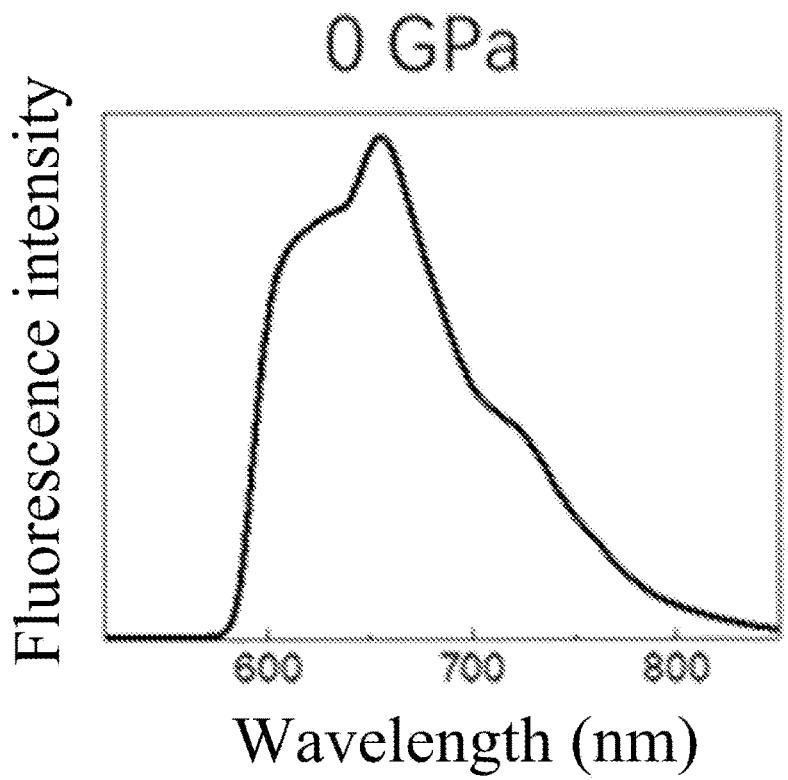
FIGS. 2A-C illustrate fluorescence spectrums of a hybrid material $(BTm)_2PbI_4$ under different pressures.
Figure 2B:
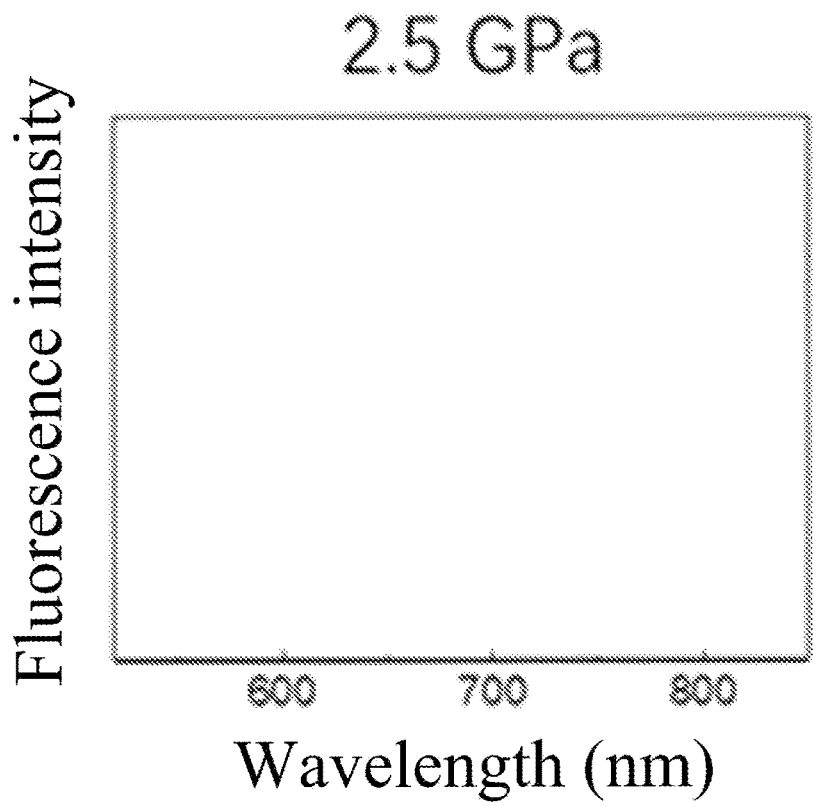
Figure 2C:
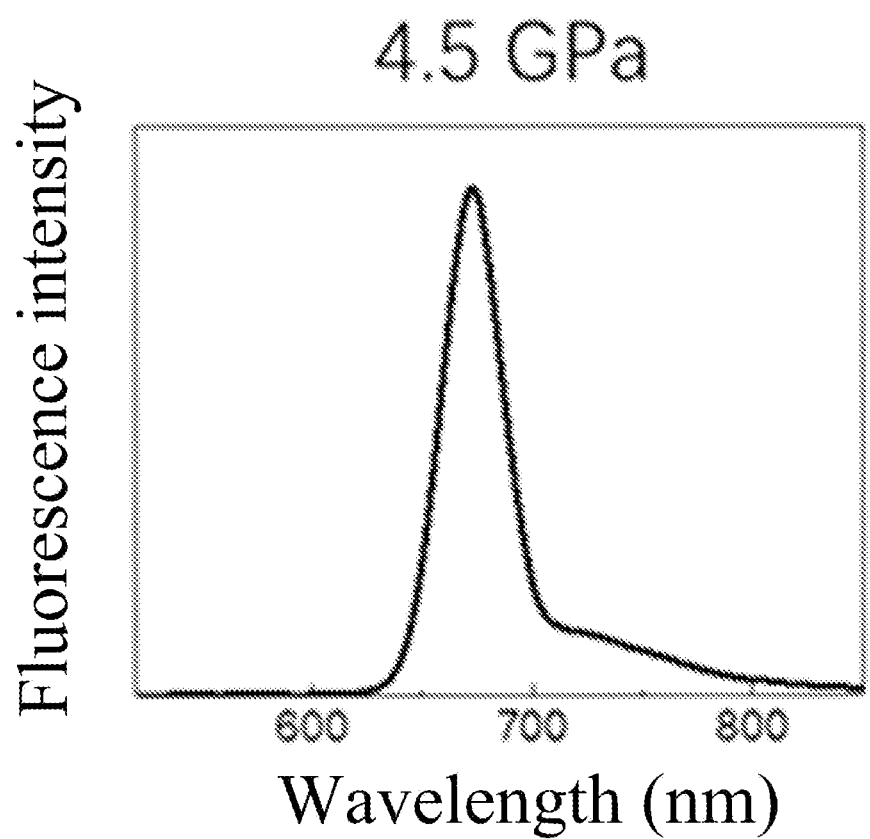

The pressures are applied to the hybrid material with the DAC, and spectrum detection is performed. Results are as shown in FIGS. 2A-C.

As can be seen, the hybrid material $(BTm)_2PbI_4$ has a wide fluorescence peak (a full width at half maximum (FWHM) is 104.7 nm) at 0 GPa, and the fluorescence comes from the $[BTm^+]$ organic cell. This is called the $[BTm^+]$ fluorescent state. The hybrid material $(BTm)_2PbI_4$ does not generate fluorescence at 2.5 GPa. This is called the non-fluorescent state. The hybrid material $(BTm)_2PbI_4$ has a narrow fluorescence peak (an FWHM is 33.3 nm) at 4.5 GPa, and the fluorescence comes from the $[PbI_4]$ inorganic cell. This is called the $[PbI_4]$ fluorescent state.

In information storage, the state with the fluorescence peak wider than 100 nm is defined as a state 0, the state without the fluorescence peak is defined as a state 1, and the state with the fluorescence peak narrower than 35 nm is defined as a state 2. In the embodiment, the $[BTm^+]$ fluorescent state, the non-fluorescent state and the $[PbI_4]$ fluorescent state of the hybrid material $(BTm)_2PbI_4$ are respectively corresponding to the state 0, the state 1 and the state 2. Therefore, the hybrid material $(BTm)_2PbI_4$ can realize three-state information storage under the pressure.

EMBODIMENT 4

In the embodiment, a hybrid material $(4Tm)_2PbI_4$ is prepared with a slow cooling method.

0.02 mmol of 4TmI and 0.01 mmol of $PbI_2$ are dissolved into 0.1 mL of HI, 0.05 mL of $H_3OP_2$ and 2 mL of isopropanol. A resulting solution is heated to 100° C. till complete dissolution, and slowly cooled to a room temperature (12 h).

EMBODIMENT 5

In the embodiment, a pressure is applied to the hybrid material $(4Tm)_2PbI_4$ to obtain energy band alignment of the hybrid material. The energy band alignment of the hybrid material $(4Tm)_2PbI_4$ is as shown in FIG. 3.

As can be seen, an energy of a conduction band and an energy of a valance band of a component B are respectively lower than an energy of a conduction band and an energy of a valance band of a component B. An energy level difference ($\Delta E3$) between the valance band of the component A and the valance band of the component B is less than 200 meV. Through testing, type-II energy band alignment is provided between the [4Tm] and the $[PbI_4]$ in the hybrid material, an energy level difference between the valance band of the [4Tm] and the valance band of the $[PbI_4]$ is about 150 meV, and the material shows a non-fluorescent state.

Figure 3:
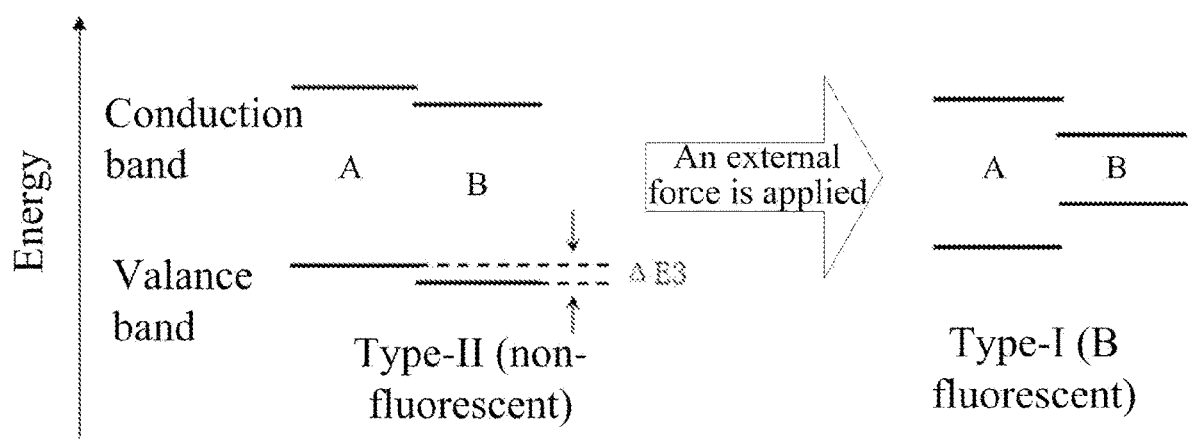
FIG. 3 illustrates transformation of type-I energy band alignment and type-II energy band alignment between a component A and a component B in a hybrid material according to Embodiment 4.

According to results shown in FIG. 3, without an external force, type-II energy band alignment is provided between the [4Tm] and the [PbI4], and the material shows the non-fluorescent state. When the external force (a pressure or a tensile force) is applied, the energy band alignment between the [4Tm] and the $[PbI_4]$ is changed. As shown in FIG. 3, when the external force reaches a special value, the hybrid material is transformed from the type-II energy band alignment to type-I energy band alignment, and shows a $[PbI_4]$ fluorescent state.

EMBODIMENT 6

In the embodiment, pressures with different intensities are applied to the hybrid material $(4Tm)_2PbI_4$. A pressure environment is provided by a DAC. Type II-a ultra-low fluorescent diamond with a size of 500 µm is used. A high-pressure sample chamber is composed of a stainless steel gasket with a thickness of about 50 µm and a hole with a diameter of about 300 µm. The hybrid material $(4Tm)_2PbI_4$ and a pressure measuring ruby ball are placed into the chamber. A ruby fluorescence method is used for measuring the pressures, and a mineral oil is used as a pressure transmitting medium.

Figure 4A:
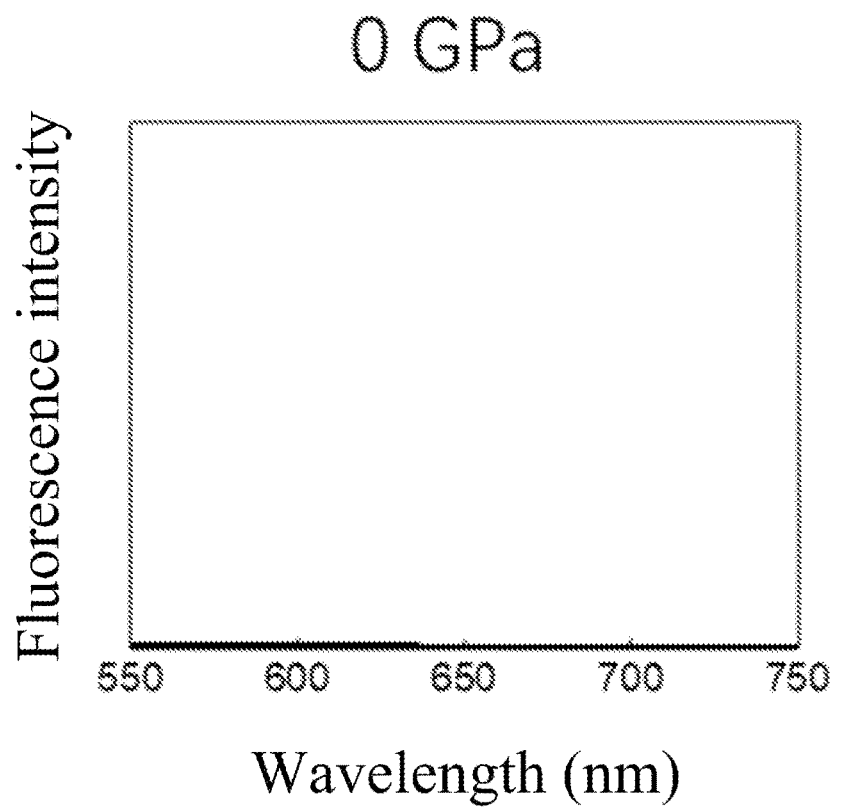
FIGS. 4A-B illustrate fluorescence spectrums of a hybrid material $(4Tm)_2PbI_4$ under different pressures.
Figure 4B:
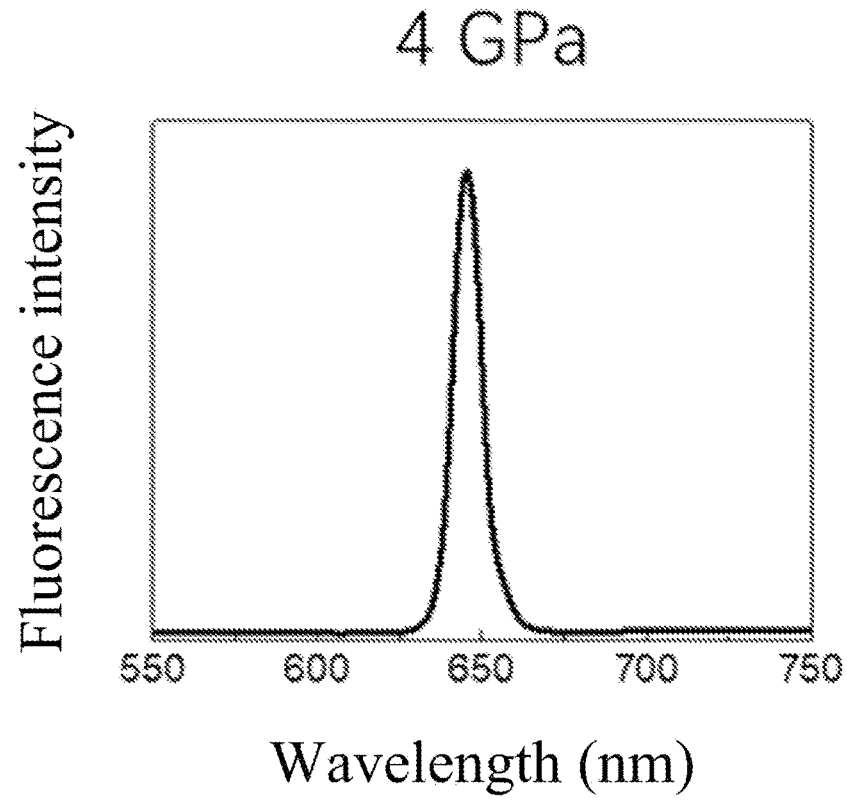

The pressures are applied to the hybrid material with the DAC, and spectrum detection is performed. Results are as shown in FIGS. 4A-B.

The hybrid material $(4Tm)_2PbI_4$ does not generate fluorescence at 0 GPa. This is called the non-fluorescent state. The hybrid material $(4Tm)_2PbI_4$ has a narrow fluorescence peak (an FWHM is 14 nm) at 4 GPa, and the fluorescence comes from the $[PbI_4]$ inorganic cell. This is called the $[PbI_4]$ fluorescent state.

In information storage, the state with the fluorescence peak is defined as a state 1, and the state without the fluorescence peak is defined as a state 0. The non-fluorescent state and the $[PbI_4]$ fluorescent state of the hybrid material $(4Tm)_2PbI_4$ are respectively corresponding to the state 0 and the state 1. Therefore, the hybrid material $(BTm)_2PbI_4$ can realize two-state information storage under the pressure.

The embodiments of the present disclosure are described above. Several examples are used for illustration of the principles and implementations of the present disclosure. The description of these embodiments is used to help illustrate the method and its core principles. Those skilled in the art can make variations to the disclosure in specific implementation and application scope based on a concept of the present disclosure. To sum up, the contents in the description shall not be understood as limitations to the present disclosure.

What is claimed is:

1. A method for information storage based on a hybrid material, comprising a step of applying an external force to a hybrid material for driving, such that the hybrid material shows a fluorescent state or a non-fluorescent state, thereby realizing information storage, wherein
   the hybrid material comprises a component A and a component B; and an energy level difference is provided between the component A and the component B.

2. The method for information storage based on a hybrid material according to claim 1, wherein in the hybrid material, at least one of an energy level difference ($\Delta E$) between a conduction band of the component A and a conduction band of the component B, and an energy level difference ($\Delta E$) between a valance band of the component A and a valance band of the component B is less than 200 meV.

3. The method for information storage based on a hybrid material according to claim 2, wherein under the driving of the external force, a movement speed of each of the conduction band and the valance band of the component B is greater than a movement speed of each of the conduction band and the valance band of the component A.

4. The method for information storage based on a hybrid material according to claim 3, wherein in the hybrid material, an energy of the conduction band of the component A is lower than an energy of the conduction band of the component B, and an energy of the valance band of the component A is higher than an energy of the valance band of the component B.

5. The method for information storage based on a hybrid material according to claim 3, wherein in the hybrid material, an energy of the conduction band and an energy of the valance band of the component A are respectively lower than an energy of the conduction band and an energy of the valance band of the component B, or the energy of the conduction band and the energy of the valance band of the component A are respectively higher than the energy of the conduction band and the energy of the valance band of the component B.

6. The method for information storage based on a hybrid material according to claim 3, wherein a lattice of the component B is more flexible than a lattice of the component A.

7. The method for information storage based on a hybrid material according to claim 2, wherein the external force comprises a pressure and/or a tensile force.

8. The method for information storage based on a hybrid material according to claim 1, wherein under the driving of the external force, a movement speed of each of the conduction band and the valance band of the component B is greater than a movement speed of each of the conduction band and the valance band of the component A.

9. The method for information storage based on a hybrid material according to claim 8, wherein in the hybrid material, an energy of the conduction band of the component A is lower than an energy of the conduction band of the component B, and an energy of the valance band of the component A is higher than an energy of the valance band of the component B.

10. The method for information storage based on a hybrid material according to claim 9, wherein the external force comprises a pressure and/or a tensile force.

11. The method for information storage based on a hybrid material according to claim 9, wherein
when the external force is not applied or an external force with a first external force value is applied to the hybrid material, the hybrid material has type-I energy band alignment; and/or,
when an external force with a second external force value is applied to the hybrid material, the hybrid material has type-II energy band alignment; and/or,
when an external force with a third external force value is applied to the hybrid material, the hybrid material has the type-I energy band alignment.

12. The method for information storage based on a hybrid material according to claim 11, wherein
when the external force is not applied or the external force with the first external force value is applied to the hybrid material, the hybrid material shows a component A fluorescent state; and/or when the external force with the second external force value is applied to the hybrid material, the hybrid material shows the non-fluorescent state; and/or
when the external force with the third external force value is applied to the hybrid material, the hybrid material shows a component B fluorescent state.

13. The method for information storage based on a hybrid material according to claim 12, wherein the component A fluorescent state is defined as 0, the non-fluorescent state is defined as 1, and the component B fluorescent state is defined as 2, thereby realizing two or three storage states in one storage cell.

14. The method for information storage based on a hybrid material according to claim 11, wherein the first external force value is less than the second external force value, and the second external force value is less than the third external force value.

15. The method for information storage based on a hybrid material according to claim 8, wherein in the hybrid material, an energy of the conduction band and an energy of the valance band of the component A are respectively lower than an energy of the conduction band and an energy of the valance band of the component B, or the energy of the conduction band and the energy of the valance band of the component A are respectively higher than the energy of the conduction band and the energy of the valance band of the component B.

16. The method for information storage based on a hybrid material according to claim 15, wherein
when the external force is not applied or an external force with a first external force value is applied to the hybrid material, the hybrid material has type-II energy band alignment; and/or,
when an external force with a third external force value is applied to the hybrid material, the hybrid material has type-I energy band alignment.

17. The method for information storage based on a hybrid material according to claim 16, wherein
when the external force is not applied or the external force with the first external force value is applied to the hybrid material, the hybrid material shows the non-fluorescent state; and/or,
when the external force with the third external force value is applied to the hybrid material, the hybrid material shows a component B fluorescent state.

18. The method for information storage based on a hybrid material according to claim 8, wherein a lattice of the component B is more flexible than a lattice of the component A.

19. The method for information storage based on a hybrid material according to claim 8, wherein the external force comprises a pressure and/or a tensile force.

20. The method for information storage based on a hybrid material according to claim 1, wherein the external force comprises a pressure and/or a tensile force.

* * * * *